United States Patent
Gao

(10) Patent No.: US 11,825,634 B2
(45) Date of Patent: Nov. 21, 2023

(54) MULTI-LOOP COOLING CONFIGURATION FOR HIGH-DENSITY SERVER RACKS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 472 days.

(21) Appl. No.: 17/033,882

(22) Filed: Sep. 27, 2020

(65) Prior Publication Data
US 2022/0104402 A1   Mar. 31, 2022

(51) Int. Cl.
*H05K 7/20* (2006.01)

(52) U.S. Cl.
CPC ..... *H05K 7/20781* (2013.01); *H05K 7/20836* (2013.01)

(58) Field of Classification Search
CPC .......... H05K 7/20781; H05K 7/20836; H05K 7/2079
See application file for complete search history.

(56) References Cited

U.S. PATENT DOCUMENTS

2017/0105313 A1*   4/2017   Shedd ................ H05K 7/20809

* cited by examiner

*Primary Examiner* — Ana M Vazquez
(74) *Attorney, Agent, or Firm* — WOMBLE BOND DICKINSON (US) LLP

(57) ABSTRACT

A cooling unit includes a unit inlet and open-loop, and closed-loop outlets. A fluid bypass line is fluidly coupled to the unit inlet and to the open-loop and closed-loop outlets. A main cooling loop is fluidly coupled to the fluid bypass line includes a heat exchanger having an inlet and an outlet. The inlet of the heat exchanger is fluidly coupled by a supply line to the fluid bypass line, and the outlet of the heat exchanger is coupled by a return line to the fluid bypass line. A pump is fluidly coupled in the return line and a two-way line is fluidly coupled to the bypass line and to the return line upstream of the pump. Different system loop designs and operation modes are configured by adjusting three way valves and bidirectional loops.

20 Claims, 10 Drawing Sheets

MULTI-LOOP COOLING CONFIGURATION FOR HIGH-DENSITY SERVER RACKS

TECHNICAL FIELD

The disclosed embodiments relate generally to liquid cooling systems for temperature control of electronic equipment and in particular, but not exclusively, to a multi-loop cooling configuration for high-density server racks.

BACKGROUND

Much modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Modern IT equipment therefore requires liquid cooling or liquid-air hybrid cooling.

As a result of the requirement for liquid cooling, some pieces of IT equipment have an on-board liquid cooling system that is thermally coupled to individual components that need cooling. But these on-board liquid cooling systems usually do not operate in isolation. They are usually coupled to at least one larger cooling system, such as liquid cooling system in an electronics rack, and the rack's cooling system can further be coupled to the liquid cooling system of a larger facility such as a data center. In such a system, the data center's cooling system circulates a working fluid through the rack cooling system, which in turn circulates the working fluid through the cooling system on the piece of IT equipment.

One challenge in designing data centers and data center racks is the mismatch between the lifetime of the data center and the lifetime of IT equipment housed in the racks or the data center. The data center and its facilities, electrical systems, cooling systems, etc., change much more slowly that the electronics housed within. Generally, the electronics change quickly and become more customized including their form factors, packaging method, system design, mechanical/thermal (air cooling and liquid cooling)/structural solutions. This rapid change leads to several associated problems. For example, different operating conditions can lead to different rack power in different scenarios. Data center design and corresponding cooling and power source availabilities might not be able to keep up—e.g., some data centers provide only cooling air, which might not be enough considering the rising power and heat load being generated, and variations in the cooling design in the IT equipment.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described of a multi-loop cooling configuration for high-density server racks. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

Described below are embodiments of an advanced design for server and rack cabinets and their associated thermal management hardware. The described embodiments provide a method for deploying server and IT equipment in a data center more efficiently and with little or no dependence on connections to a facility, thus lessening the impact of some of the design challenges discussed above.

Existing solutions do not provide the multi-loop configurations described below. In addition, the described embodiments can include the following superior features: the overall architecture of the hardware and IT cabinet combination design; multiple-loop operation mode; loop control using multiple valves/three-way valves to configure different cooling loops; system arrangement mechanism; system modular design concept with the core unit; sensing system implementation and the corresponding control design; and closed-loop and open-loop operating modes.

In the described embodiments an IT enclosure is combined and/or assembled with cooling hardware in a cooling unit to form a full system, and together the IT enclosure and cooling unit can implement several cooling loop configurations. The cooling hardware design enables the system to be controlled and configured in a closed loop or an open loop, and to switch between them. A sensing system and the system hardware arrangement enable the loops to operate with high efficiency, as well as enabling switching between loops without major impact on normal operation or with minimum impact on the operation. The embodiments can fit different types of IT enclosures and most data center systems. In addition, the embodiments can accommodate different IT containers, PoD, and cluster requirements in a shared environment.

Figure 1:
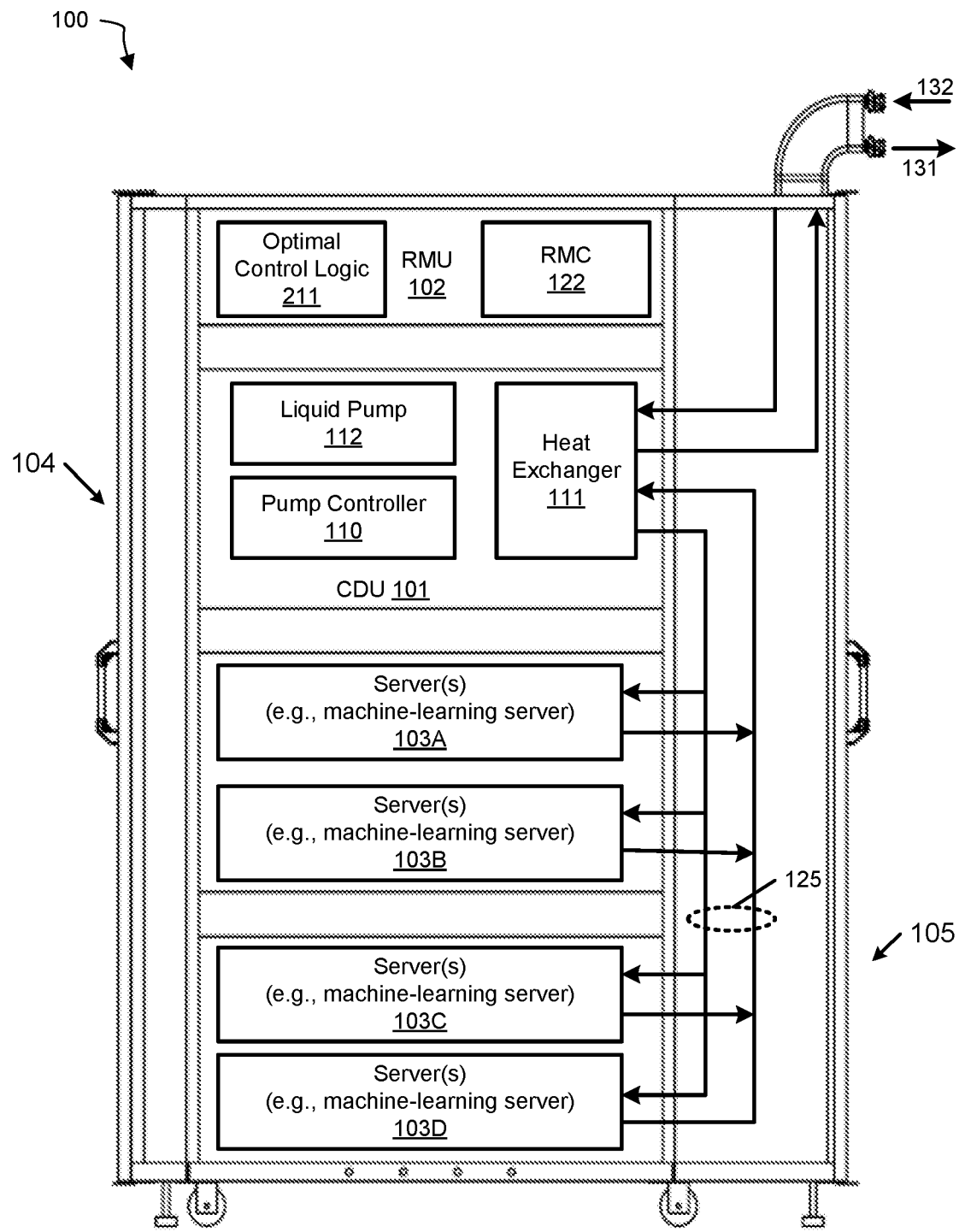
FIG. 1 is a block diagram of an embodiment of an IT container including an electronic rack with electronics and cooling systems housed within.

FIG. 1 is a block diagram illustrating a side view of an embodiment of an electronics rack, which is a type of IT container commonly used in data centers. In one embodiment, electronic rack 100 includes CDU 101, rack management unit (RMU) 102, and one or more server blades 103A-103D, collectively referred to as server blades 103.

Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT container whose supply/return lines 131-132 can be fluidly coupled to a cooling unit coupled to rack 100 (see FIG. 2A et seq.).

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.,) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2:
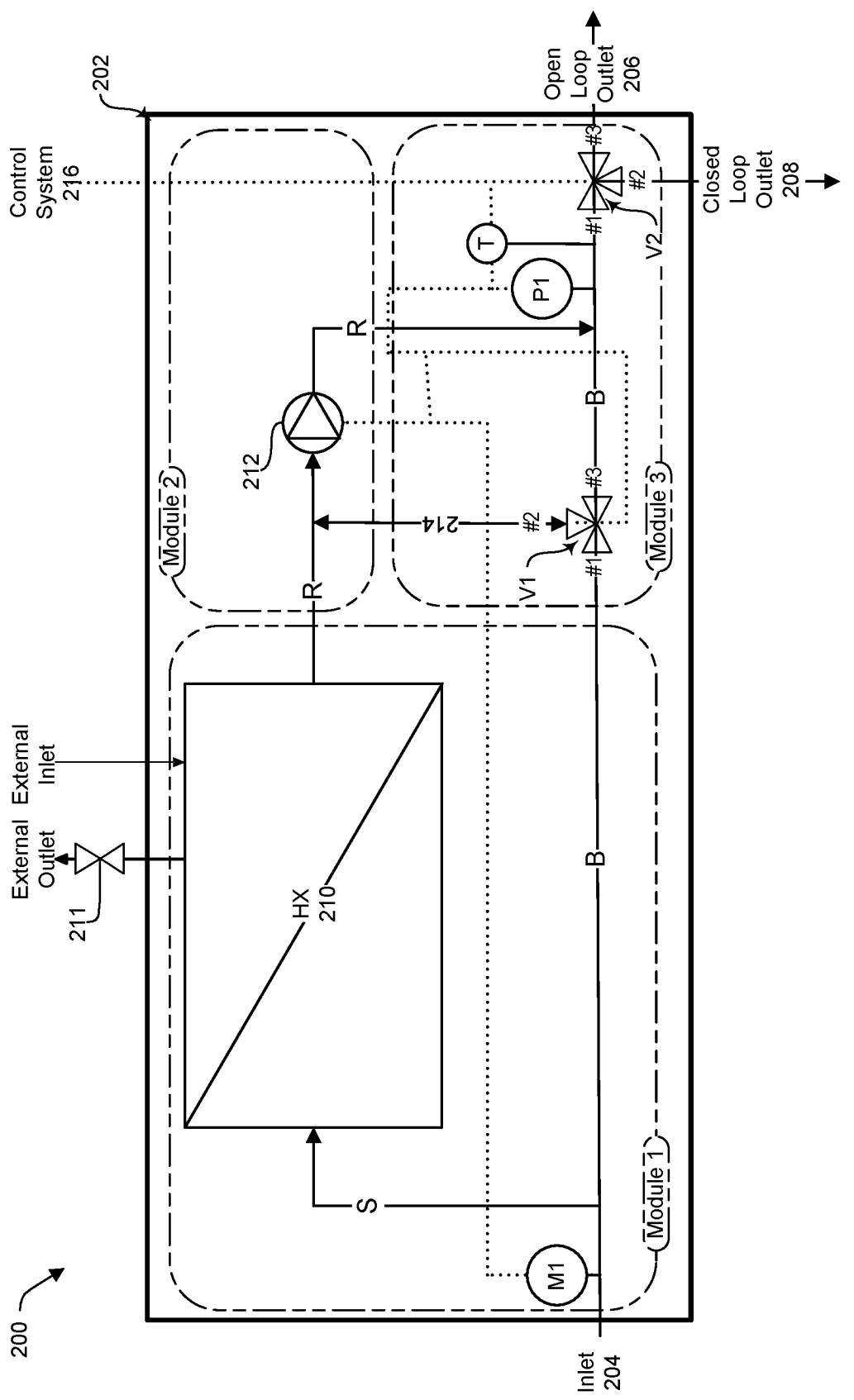
FIG. 2 is a block diagram of an embodiment of a cooling unit.

FIG. 2 illustrates an embodiment of a cooling unit 200 that can be coupled with one or more IT containers (see, e.g., FIGS. 4-5) to cool electronics within the containers. Cooling unit 200 includes a housing 202 having a unit inlet 204 and two cooling outlets: an open-loop outlet 206 and a closed-loop outlet 208. Within cooling unit 200, a bypass line B fluidly connects inlet 204 to a second three-way valve V2. Valve V2 in turn fluidly couples bypass line B to open-loop outlet 206 and closed-loop outlet 208, so that valve V2 can be used to switch between open loop and closed-loop configurations. A first three-way valve V1 is also fluidly coupled into bypass line B between inlet 204 and valve V2. Three-way valves V1 and V2 both have three fluid ports, numbered #1-#3 in the figure. In both three-way valves V1 and V2, fluid can be directed from any port to one or both of the other ports; when the three-way valve directs flow from one port into both other ports, the valve can also change the proportion of flow going into each output port. In addition, in each valve V1 and V2 fluid flow from each port to another port can be independently adjusted without impact on the other port, and in one mode of operation all three ports in a valve can be closed.

Cooling unit 200 also includes a main loop or cooling loop fluidly coupled to bypass line B. The main loop includes a heat exchanger (HX) 210 with an inlet that is fluidly coupled to bypass line B at or near inlet 204 by a supply line S. A return line R fluidly couples an outlet of heat exchanger 210 to bypass line B between first valve V1 and second valve V2; with this arrangement supply line S, heat exchanger 210, return line R, and a part of bypass line B form the main cooling loop. A pump 212 is fluidly coupled into return line R to circulate cooling fluid through the main loop and at least part of the bypass line. In the illustrated embodiment, heat exchanger 210 also includes an external inlet and an external outlet. The external outlet can include a valve 211 to turn the external outlet on and off. Also, valve 211 can be used to adjust the flow rate. In another embodiment, a pump can be used for adjusting fluid flow rate. Both the external outlet and external inlet can be coupled to a data center cooling system to supply cooling fluid to heat exchanger 210, with the external inlet coupled to a facility supply and the external outlet coupled to a facility return. Other embodiments of cooling unit 200 can be entirely self-contained and need not use an external inlet or external outlet.

A two-way line 214 is fluidly coupled to three-way valve V1 and to return line R upstream of pump 212. Fluid can flow both ways through two-way line 214: from return line R to valve V1, or the other way from valve V1 to return line R, depending on the unit's mode of operation. Bypass line B, together with two-way line 214 and three-way valve V1, are designed to address abnormal operating modes, thereby increasing system robustness, serviceability, and flexibility. Two-way line 214, as well as bypass line B, supply line S, and return line R, can all be made of flexible tubing, rigid tubing, or some combination of rigid and flexible tubing.

In addition to the flow hardware described above, cooling unit 200 can include various sensors to monitor conditions within the unit. Cooling unit 200 includes a flow meter M1, a pressure sensor P1, and a temperature sensor T, although other embodiments can include additional or different sensors for measuring these or other quantities within the unit. In the illustrated embodiment, flow meter M1 is positioned near inlet 204, while pressure sensor P1 and temperature sensor T are positioned in bypass line B downstream of where return line R joins the bypass line—specifically, in this embodiment, between where return line R is fluidly coupled to bypass line B and three-way valve V2. In other embodiments, the sensors can be positioned differently (see, e.g., FIG. 3). The various sensors in unit 200 are communicatively coupled to a control system 216, and control system 216 is also communicatively coupled to the flow hardware within unit 200 that can be controlled during operation—in this embodiment, pump 212 and three-way valves V1 and V2. The dotted lines in the figure illustrate the signal connections among the sensors, the control system, and the flow hardware. Thus, in the illustrated embodiment control system 216 can change the speed of pump 212, and the positions of three-way valves V1 and V2, based on input from flow meter M1, pressure sensor P1, and temperature sensor T, and any additional or different sensors that might be present.

For ease and flexibility of product design, as well as system assembly, availability, and service, in some embodiments the components within cooling unit 200 can be grouped into modules that can be separately manufactured and assembled. In the illustrated embodiment, the components are grouped into three modules, shown by double-dashed lines. Module 1 includes heat exchanger 210, flow meter M1, and associated fluid connections. Module 2 includes the pumping system and associated fluid connections, and Module 3 includes the remainder of the components in the system and their associated fluid connections. In other embodiments, the components within unit 200 can be modularized (i.e., grouped into modules) differently than shown (see, e.g., FIG. 3).

In operation, cooling unit 200 can operate in a closed-loop mode, an open-loop mode, or a hybrid closed-loop/open-loop mode, depending primarily on the setting of three-way valve V2. These modes of operation are described below in connection with FIGS. 4-5. Three-way valve V1 is used together with two-way line 214 mostly to regulate the internal operation of cooling unit 200, as described below in connection with FIGS. 7A-7B.

Figure 3:
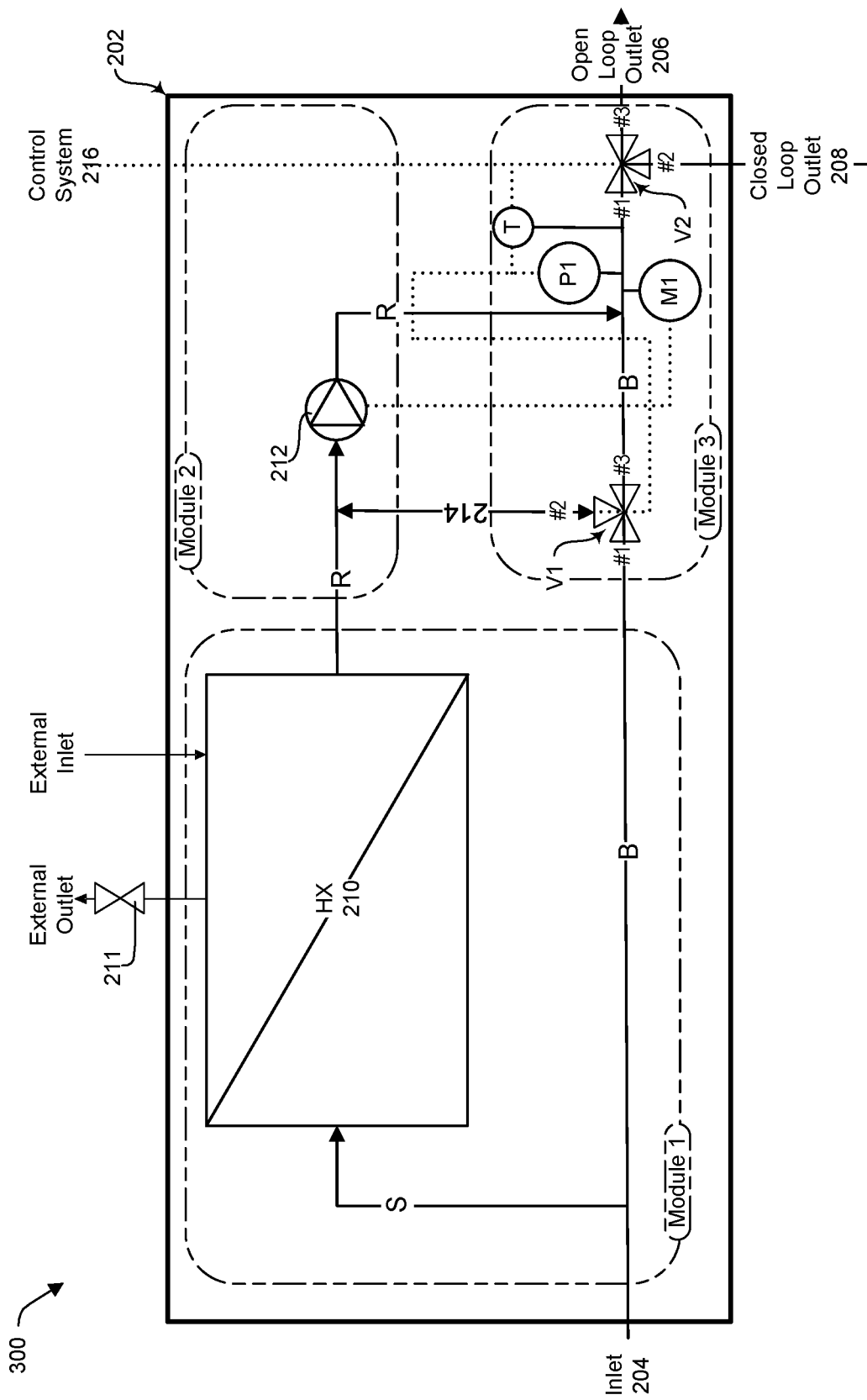
FIG. 3 is a block diagram of another embodiment of a cooling unit.
Figure 4:
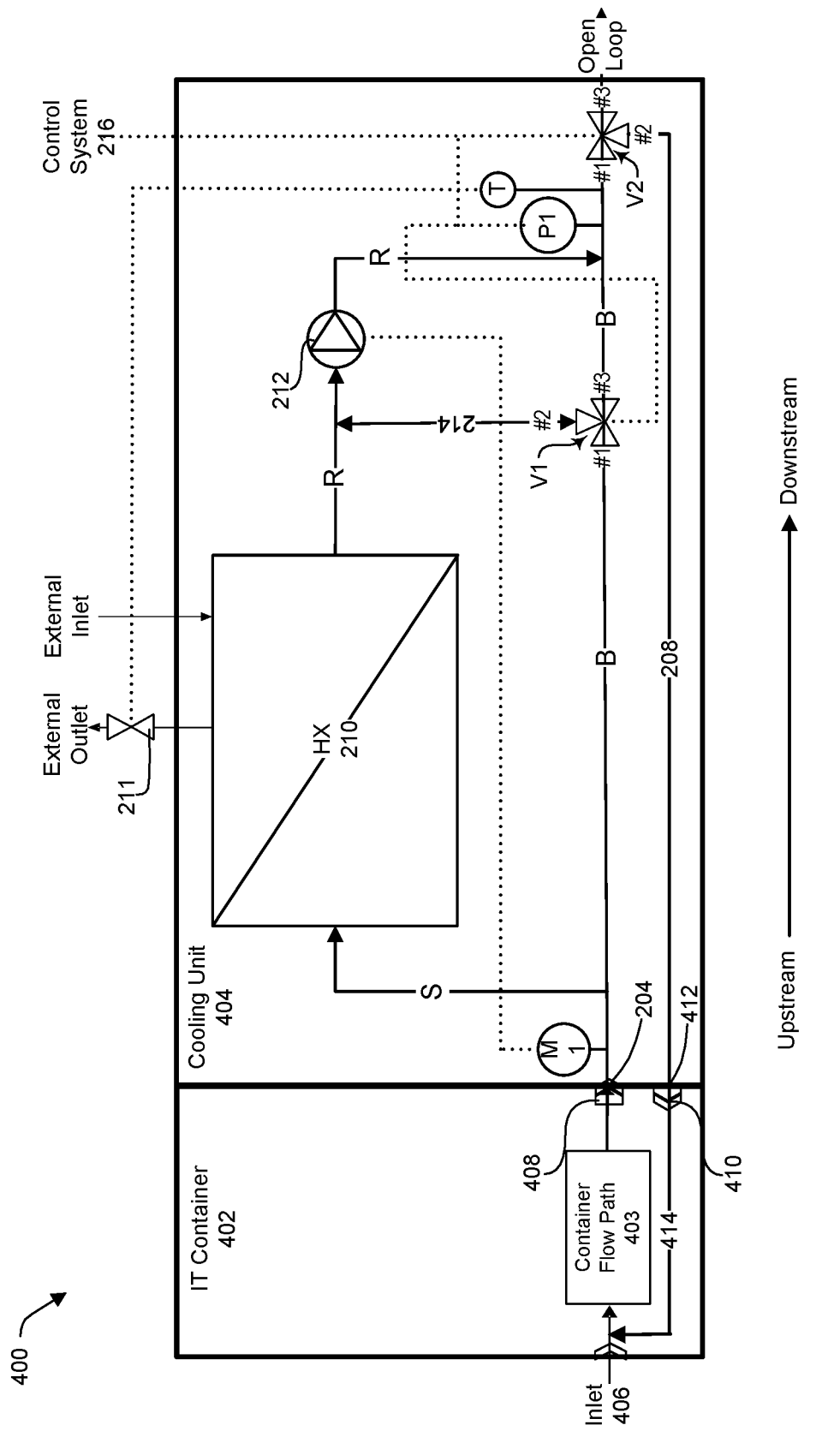
FIG. 4 is a block diagram of an embodiment of a system with a cooling unit coupled to an IT container.
Figure 5:
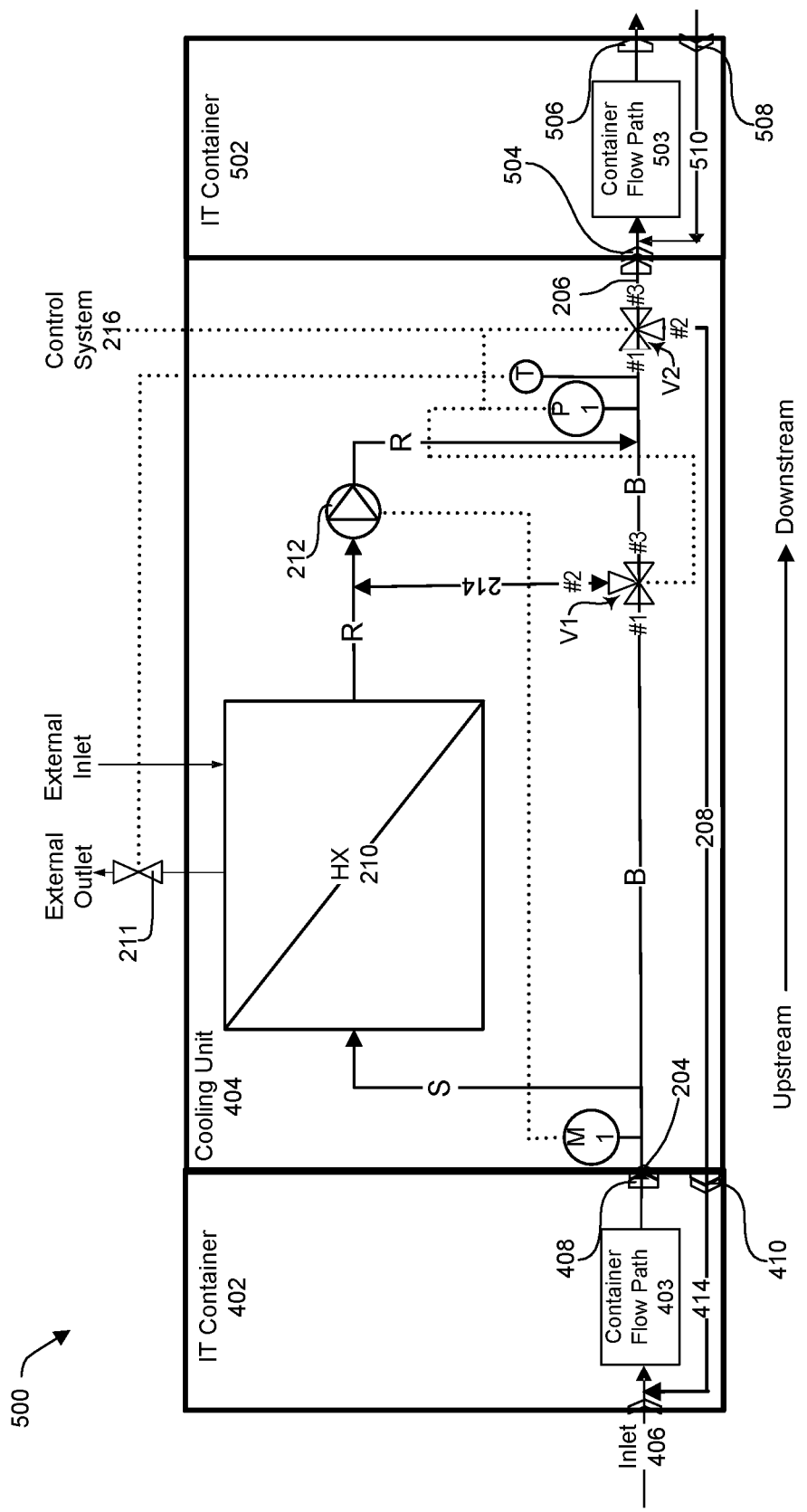
FIG. 5 is a block diagram of another embodiment of a system with a cooling unit coupled to a pair of IT containers.

FIG. 3 illustrates an embodiment of a cooling unit 300 that can be coupled with one or more IT containers (see, e.g., FIGS. 4-5). Cooling unit 300 is in most respects similar to cooling unit 200, with substantially the same components and the same variations in different embodiments. The primary difference between cooling units 200 and 300 is that in unit 300 the components are positioned differently and also modularized differently. In unit 300, instead of being positioned near inlet 204, flow meter M1 is coupled to bypass line B between three-way valves V1 and V2, downstream of where return line R fluidly couples to bypass line B (i.e., downstream of the pump discharge). Positioning the flow sensor M1 here allows the major control elements of unit 300—sensors M1, P1, and T, three-way valves V1 and V2, and the associated signal connections—to be grouped together in Module 3 instead of having flow meter M1 positioned in Module 1 as in unit 200. This modularization introduces a more compact system packaging and integration method for a better and more efficient product and design method. IT also provides other important benefits besides the product design, such as for system integrators, components providers as well as end users.

FIG. 4 illustrates an embodiment of a system 400 that couples a cooling unit 404 to an information technology (IT) container 402. In the illustrated embodiment, cooling unit 404 corresponds to cooling unit 200 shown in FIG. 2, but other embodiments of system 400 can of course use a different cooling unit embodiment than shown.

IT container 402, as its name suggests, contains heat-generating IT components and includes a container flow path 403 by which cooling fluid entering IT container 402 is delivered to the heat-generating components. The container flow path 403 can be understood as the cooling fluid management design for the IT container. FIG. 1 illustrates an embodiment of a container flow path 403 in a data center rack, but other embodiments of IT container 402 can have container flow paths different than shown. Cooling unit 404 is not limited to any particular container flow path, but can instead be used with any flow path within IT container 402. IT container 402 also includes an inlet 406 and an outlet 408, and container flow path 403 is fluidly coupled by fluid lines to both inlet 406 and outlet 408. IT container 402 also includes a further closed-loop container inlet 410 that is fluidly coupled by a closed-loop flow path 414 between closed-loop container inlet 410 and a position upstream of container flow path 403, between container inlet 406 and the inlet of container flow path. Cooling unit 404 similarly includes on inlet 204 coupled to bypass line B and includes an outlet 412 fluidly coupled to closed-loop outlet 208. The fluid lines within IT container 402 can be made of rigid tubing, flexible tubing, or both, and can be preinstalled within the IT container to make it more modular.

IT container 402 is positioned upstream of cooling unit 404, with its container outlet 408 fluidly coupled to unit inlet 204 and its closed-loop container inlet 410 fluidly coupled to outlet 412. In one embodiment, fluid coupling at container inlet 406, between container outlet 408 and unit inlet 204, and between outlet 412 and closed-loop container inlet 410 can be accomplished using quick-disconnect fittings or blind-mating fittings, but other embodiments can of course use different fluid couplings.

In the illustrated configuration, system 400 operates in closed-loop mode, where it cools upstream IT container 402. When valve V2 directs fluid from port #1 to port #2, it forms a closed loop for the IT enclosure; when the V2 directs fluid from port #1 to port #3, it forms an open loop connecting the unit to a larger recirculation system.

Cooling fluid enters IT container 402 through inlet 406, for instance from another cooling unit positioned upstream (not shown). The cooling fluid flows through container flow path 403, where it absorbs heat from IT components and electronics, and the now-hot cooling fluid exits the IT container through outlet 408. As it exits outlet 408, the now-hot cooling fluid enters cooling unit 404 through inlet 204 and flows through supply line S into heat exchanger 210, where the fluid is cooled. After it exits the heat exchanger through return line R and pump 212 and bypass line B, the now-cool fluid flows to valve V2, which is set to direct the fluid through port #2 into closed-loop outlet 208. Closed-loop outlet 208 is fluidly coupled to cooling unit outlet 412, so that the now-cool fluid flows through the closed-loop outlet to unit outlet 412. The fluid flows to unit outlet 412 and is received into IT container 402 through inlet 410 and is then directed back into the container flow path

403. In this closed-loop mode, then, cooling unit 404 recirculates cooling fluid to cool the upstream IT container 402. The fluid line that connects inlet 410 and container flow path 403 can be assembled separately or considered as part of the container flow path 403. The function of this fluid line is similar to the function of closed-loop outlet 208: to complete a closed loop for the IT container and cooling unit.

FIG. 5 illustrates an embodiment of a system 500. The figure illustrates how a system can be arranged in a cluster or a data center. System 500 is in most respects similar to system 400. The primary difference between systems 500 and 400 is that in system 500 cooling unit 404 is coupled to both an upstream IT container 402 and a downstream IT container 502. As in system 400, in system 500 cooling unit 404 corresponds to cooling unit 200 shown in FIG. 2, but other embodiments of system 400 can of course use a different cooling unit than shown.

IT containers 402 and 502 both contain heat-generating IT components. Container 402 includes a container flow path 403 by which cooling fluid entering IT container 402 is delivered to its heat-generating components, and similarly container 502 includes a container flow path 503 by which cooling fluid is delivered to its heat-generating components. As before, cooling unit 404 is not limited to any particular container flow path, but can be used with any container flow path. IT container 402 includes inlets 408 and 410 and outlet 408, as described above for FIG. 4. IT container 502 similarly includes an inlet 504, an outlet 506, and a container flow path 503 fluidly coupled to both inlet 504 and outlet 506. IT container 502 also includes a closed-loop container inlet 508 that is fluidly coupled by a closed-loop flow path 510 between closed-loop container inlet 508 and a position upstream of container flow path 503, between inlet 504 and the inlet of the container flow path. The fluid couplings within IT container 502 are as described above for IT container 402.

IT container 402 is positioned upstream of cooling unit 404 and is fluidly coupled to the cooling unit as described above for FIG. 4. IT container 502, on the other hand, is positioned downstream of cooling unit 404, with its inlet 504 fluidly coupled to open-loop outlet 206. Outlet 506 and inlet 508 can be coupled to another cooling unit further downstream (not shown). In one embodiment the fluid couplings between open-loop outlet 206 and inlet 504, between outlet 506 and whatever lies downstream, and between inlet 508 and whatever lies downstream, can use quick-disconnect fittings or blind-mating fittings, but of course other embodiments can use different fluid couplings.

In the illustrated configuration, system 500 can operate closed-loop mode, open loop mode, or a combination of the two, depending on how three-way valve V2 is set. If three-way valve V2 directs flow only into port #2, then system 500 operates in closed-loop mode to cool upstream IT container 402, as described above for FIG. 4. But if three-way valve V2 is set to direct flow into port #3, then it operates in open-loop mode to cool downstream IT container 502. In this case, when system 500 is operated in closed-loop mode, IT container 402 and cooling unit 404 can form one closed loop, while IT container 502 and its downstream cooling unit can form another loop. When operating in open-loop mode, fluid arriving at three-way valve V2—whether uncooled fluid received through bypass line B or cooled fluid that has traveled through the cooling loop that includes supply line S, heat exchanger 210, and return line R—is directed into open-loop outlet 206, which then directs the fluid into inlet 504, through container flow path 503, and through outlet 506 into whatever lies downstream of IT container 502. If there is another cooling unit 404 downstream of IT container 502, whether inlet 508 receives any fluid will depend on whether the downstream cooling unit is operating in open-loop or closed-loop mode. If in cooling unit 404 valve V2 is set to direct fluid partially into port #2 and partially into port #3, then cooling unit 404 can operate in a hybrid open-loop/closed-loop mode, where it provides partial cooling for both upstream IT container 402 and downstream IT container 502.

FIGS. 6A-6F illustrate, in simplified form, embodiments of flow paths that cooling units 200 or 300 can implement when coupled with upstream and/or downstream IT containers, for instance as shown in FIGS. 4-5. In each figure, a cooling unit 604 is fluidly coupled to an upstream IT container 602 and a downstream IT container 606. Downstream IT container 606 can be coupled to another cooling unit 608 and other IT containers and cooling units further downstream, and IT container 602 can similarly be coupled to upstream IT containers and cooling units. In each figure, the flow path is shown by a dashed line. For the description below, system 600 is assumed to be configured similarly to system 500: upstream IT container 602 is assumed to be configured similarly to IT container 402, downstream IT container 606 is assumed to be configured similarly to IT container 502, and cooling unit 604 is assumed to be configured similarly to cooling unit 404. But other embodiments can of course have other configurations.

Figure 6A:
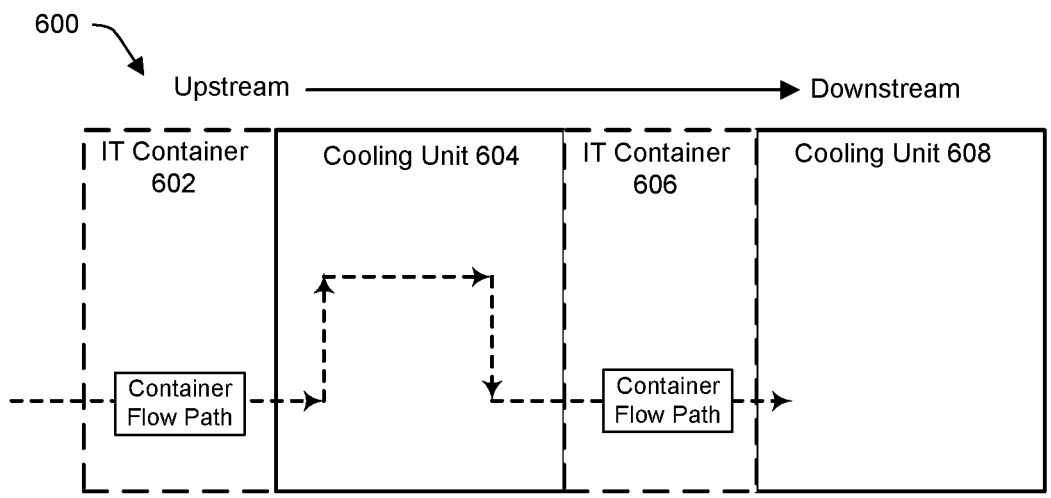
FIGS. 6A-6F are diagrams of embodiments of flow paths that can be implemented with the cooling unit in the system embodiment of FIG. 5.
Figure 6B:
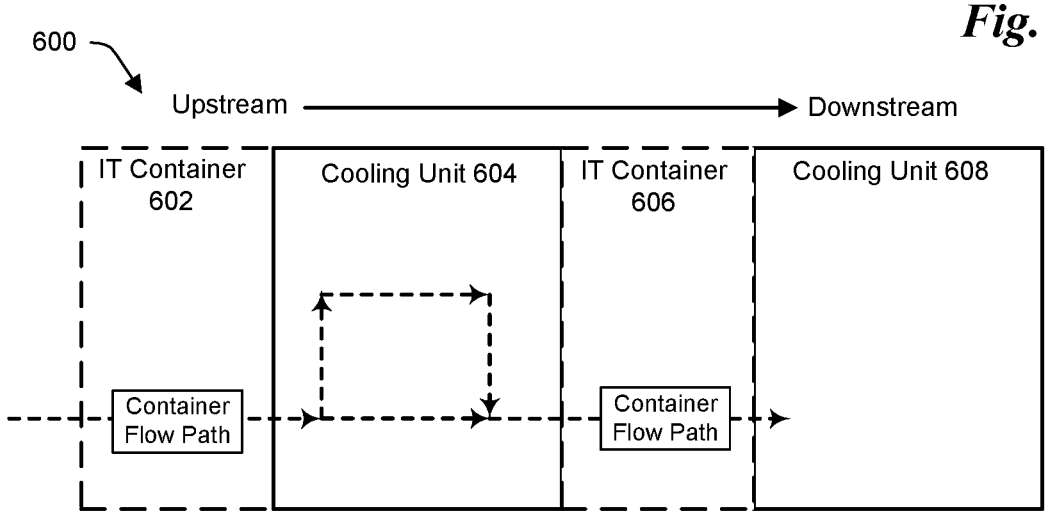
Figure 6C:
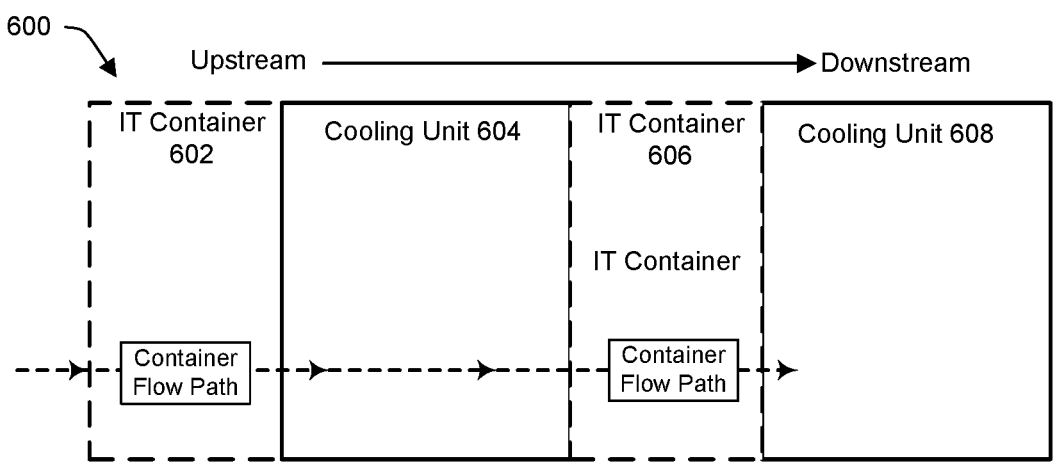

FIGS. 6A-6C illustrate open-loop operation. FIG. 6A illustrates open-loop operation with cooling. Fluid enters upstream IT container 602 and flows through the container flow path into cooling unit 604. Once inside cooling unit 604, the fluid flows through the cooling loop (e.g., through supply line S, heat exchanger 210, and return line R) and then flows out of cooling unit 604 and into downstream IT container 606. This flow configuration can be implemented, for instance, by closing all three ports of three-way valve V1 and by setting three-way valve V2 to direct all flow from port #1 through port #3 into the open-loop outlet.

FIG. 6B illustrates open-loop operation with cooling and bypass. Fluid enters upstream IT container 602 and flows through the container flow path into cooling unit 604. Once inside cooling unit 604, the fluid simultaneously flows through bypass line B and through the cooling loop (e.g., through supply line S, heat exchanger 210, and return line R), then flows out of cooling unit 604 and into downstream IT container 606. This flow configuration can be implemented, for instance, by setting the ports of three-way valve V1 to direct all flow from port #1 to port #3 while also setting three-way valve V2 to direct all flow from port #1 through port #3 into the open-loop outlet.

FIG. 6C illustrates open-loop operation with bypass. Fluid enters upstream IT container 602 and flows through the container flow path into cooling unit 604. Once inside cooling unit 604, the fluid flows only through the bypass line B, then flows out of cooling unit 604 and into downstream IT container 606. This flow configuration can be implemented, for instance, by setting the ports of three-way valve V1 to direct all flow from port #1 to port #3, setting three-way valve V2 to direct all flow from port #1 through port #3 to the open-loop outlet, and turning off pump 212.

Figure 6D:
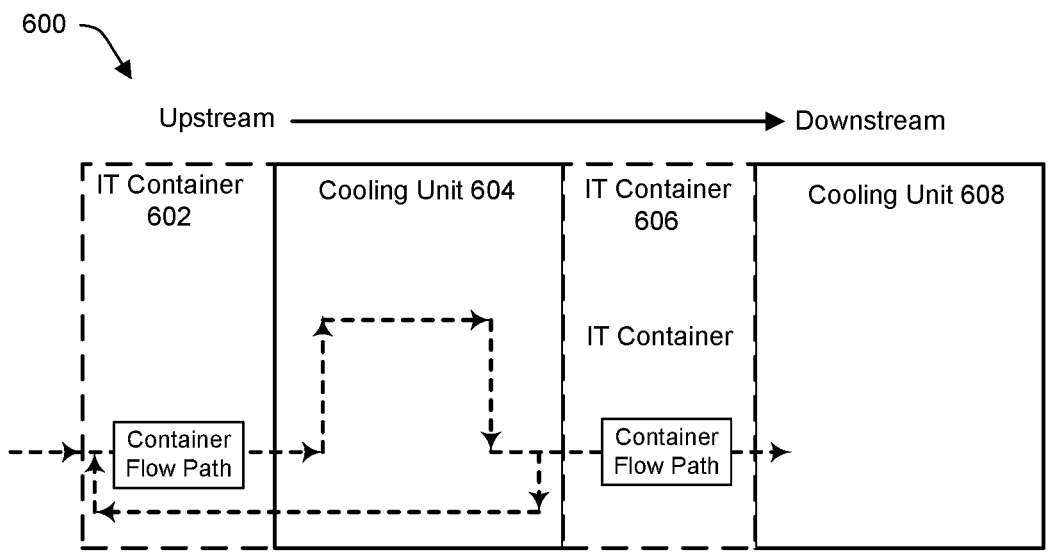
Figure 6E:
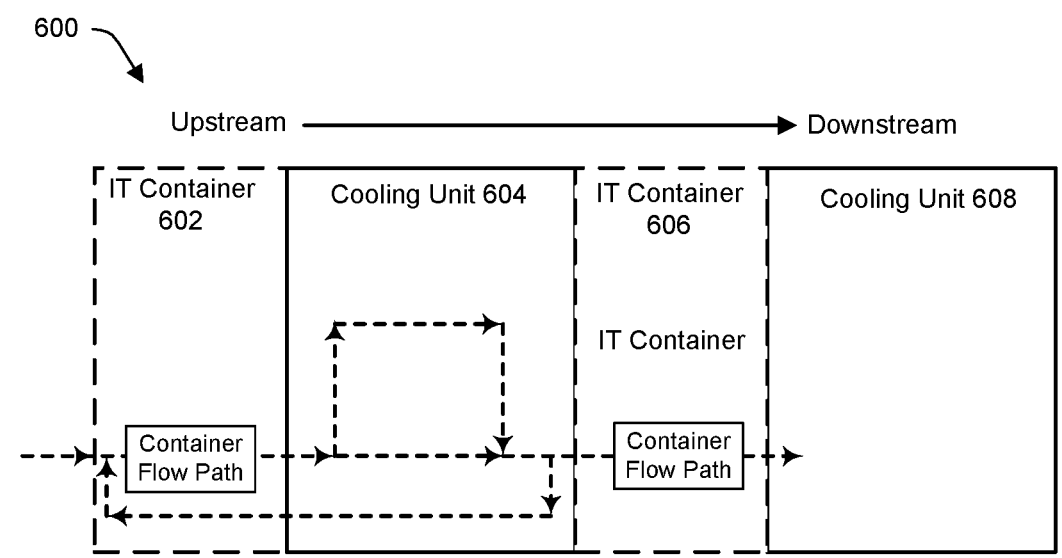

FIGS. 6D-6E illustrate closed-loop operation. FIG. 6D illustrates open-loop operation with cooling. Fluid enters upstream IT container 602 and flows through the container flow path into cooling unit 604. Once inside cooling unit 604, the fluid flows through the cooling loop (e.g., through supply line S, heat exchanger 210, and return line R) and then flows out of cooling unit 604 and back to upstream IT container 602, rejoining the flow path upstream of the container flow path. This flow configuration thus establishes recirculation and can be implemented, for instance, by closing all three ports of three-way valve V1 and by setting three-way valve V2 to direct all flow from port #1 to the closed-loop outlet through port #2. If in cooling unit 604 valve V2 is set to direct fluid partially into port #2 and partially into port #3, then cooling unit 604 can operate in a hybrid open-loop/closed-loop mode, where it provides partial cooling for both upstream IT container 602 and downstream IT container 608, as illustrated.

FIG. 6E illustrates closed-loop operation with cooling and bypass. Fluid enters upstream IT container 602 and flows through the container flow path into cooling unit 604. Once inside cooling unit 604, the fluid simultaneously flows through the bypass line B and through the cooling loop (e.g., through supply line S, heat exchanger 210, and return line R), then flows out of cooling unit 604 and into upstream IT container 602. This flow configuration can be implemented, for instance, by setting the ports of three-way valve V1 to direct all flow from port #1 to port #3 (i.e., closing port #2) while also setting three-way valve V2 to direct all flow from port #1 to the closed-loop outlet through port #2 (i.e., closing port #3). If in cooling unit 604 valve V2 is set to direct fluid partially into port #2 and partially into port #3, then cooling unit 604 can operate in a hybrid open-loop/closed-loop mode, where it provides partial cooling for both upstream IT container 602 and downstream IT container 608, as illustrated.

Figure 6F:
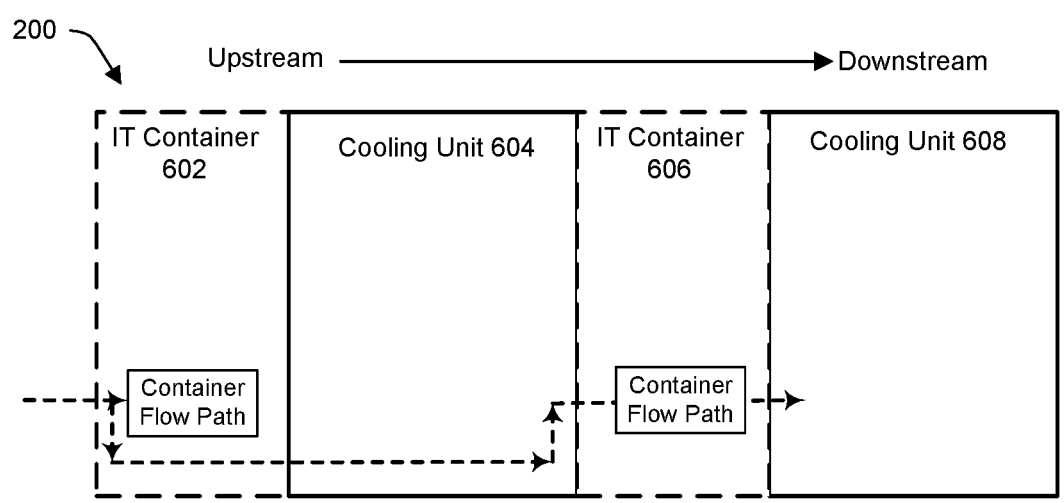

FIG. 6F illustrates a flow path that can be used to bypass cooling unit 604 and IT container 602 completely. This can happen, for instance, if the unit or some component inside the unit needs to be repaired or replaced and the components in IT container 606 can operate at a higher temperature for the duration of the repair or replacement, or the IT container is under service. Fluid enters upstream IT container 602 and, instead of entering the container flow path, it flows into the closed loop outlet in the reverse direction from normal operation. The fluid flows through the closed-loop outlet to three-way valve V2, where it is directed into IT container 606, thus bypassing cooling unit 604 almost entirely. This flow configuration can be implemented, for instance, by closing outlet 408 and setting three-way valve V2 to direct all flow entering the closed-loop outlet at port #2 to the open-loop outlet through port #3 (i.e., closing port #1).

Figure 7A:
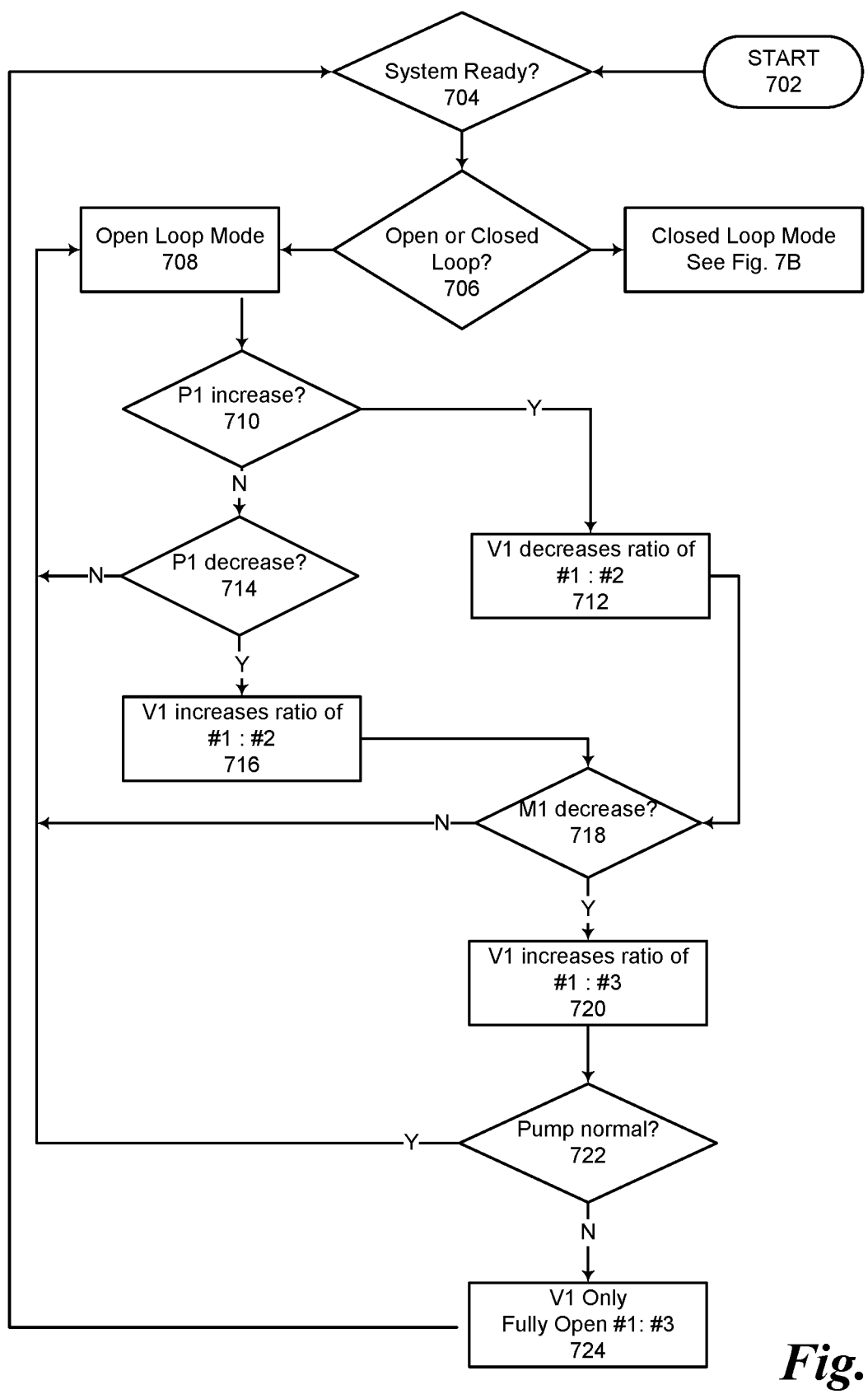
FIGS. 7A-7B together are a flow chart of an embodiment of a process for controlling a cooling unit in a system embodiment such as the one of FIG. 5.
Figure 7B:
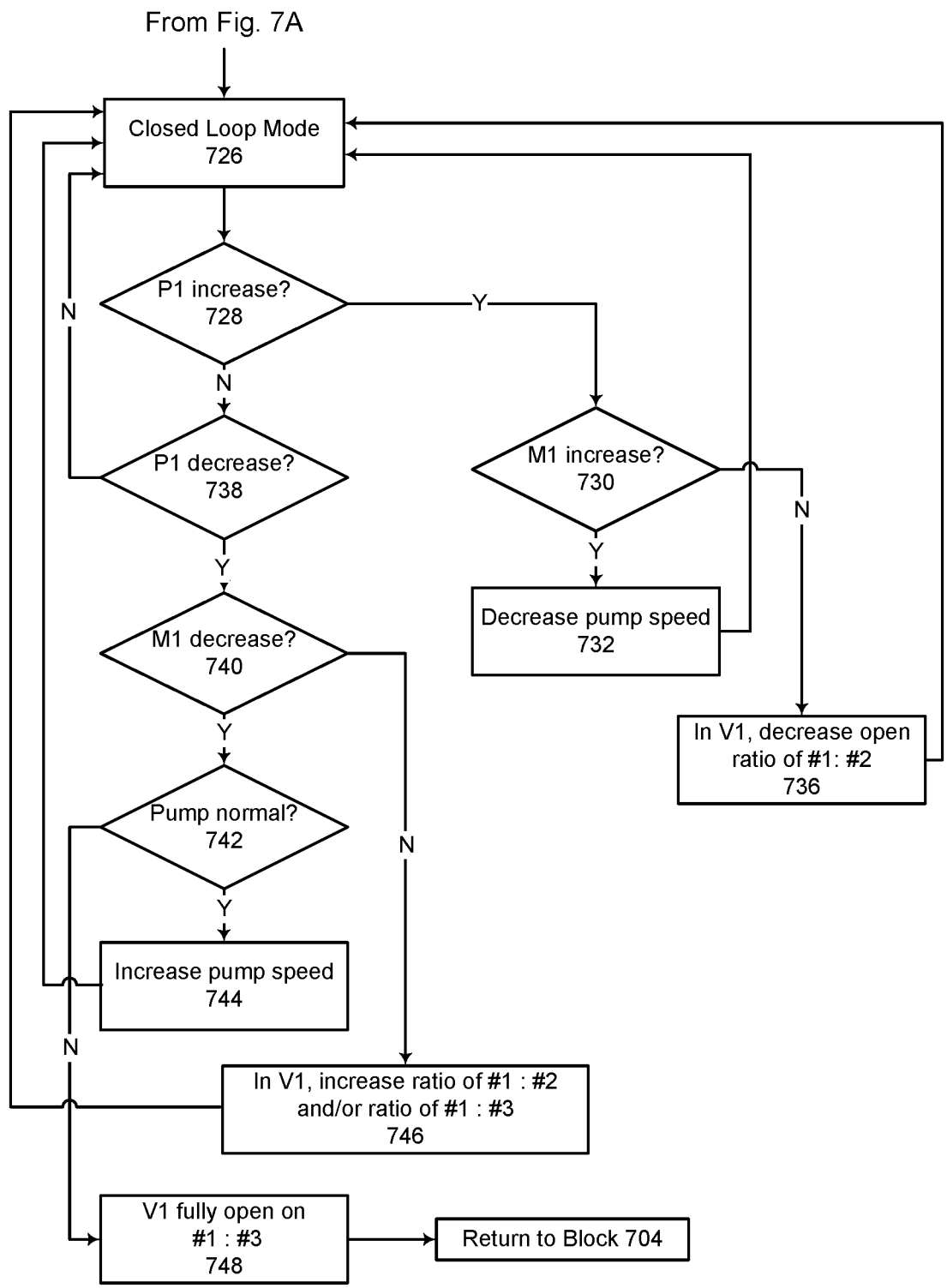

FIGS. 7A-7B together illustrate an embodiment of a process that can be used by control system 216 (see FIGS. 2-5) to control operation of a cooling unit in both open-loop and closed-loop modes. FIG. 7A illustrates the open-loop mode, FIG. 7B the closed-loop mode. The process is described with reference to cooling unit 200, but is also applicable to other cooling unit embodiments. The figures only illustrate operation that is purely open-loop or purely closed-loop; the hybrid open-loop/closed-loop operation is not explicitly discussed, but in one embodiment would be a combination of the open-loop and closed-loop processes disclosed.

The process begins at block 702. At block 704, the process checks whether the system is ready to operate—that is, whether control system 216 has been initialized, all sensors (M1, P1, and T) are functioning properly, and all mechanical elements such as valves V1 and V2 and pump 212 are operating properly. If at block 704 the system is not ready to operate, the process waits until the system is ready. But if at block 704 the system is ready, the process moves to block 706. At block 706, the process determines whether system operation will be open-loop or closed-loop. If at block 706 the process determines that the operation will be open-loop, it moves to the open-loop process, starting at blocks 708 and including blocks 708-724.

At block 710 the process checks whether pressure sensor P1 indicates a pressure increase. This is to measure if any upstream changes are impacting the pressure. If at block 710 the process detects a pressure increase, it means there is a pressure pulse or an otherwise rising pressure in the system. Generally, it is undesirable to propagate pressure pulses or increases downstream, so the process moves to block 712 were three-way valve V1 is switched partly from port #1 to port #2 by increasing open ratio (i.e. by directing more fluid flow from port #1 to port #2), which prevents pressure increases from propagating downstream by directing some of pressure into the closed-loop outlet. In another embodiment, to address the P1 increase, V2 can be used by decreasing its open ratio from #1 to #2 (i.e. by directing less fluid flow from port #1 to port #2).

The process then moves to block 718, where it checks whether the flow rate, as measured by flow meter M1, is decreasing as a result of the adjustment of valve V1. If at block 718 the flow rate is not decreasing, the process returns to the beginning of the open-loop process at block 708. This is to ensure the proper flow rate is maintained for the outlet port and inlet port. An increase on the flow rate will cause a P1 increase at 710. But if at block 718 the flow rate is decreasing, the process moves to block 720 where three-way valve V1 is adjusted to increase the ratio of port #1 to port #3—that is, adjusted to direct more flow from bypass line B to three-way valve V2 and less to two-way line 214, thus attempting to increase the flow rate. The process then moves to block 722, where it checks whether pump 212 is operating normally. If at block 722 the pump is operating normally the process returns to block 708. But if at block 722 the pump is not operating properly, that means the pump cannot deliver the needed flow rate. To compensate for the pump's inability to deliver the needed flow rate, the process moves to block 724, where three-way valve V1 fully opens ports #1 and #3, thus directing all flow to three-way valve V2 for distribution into downstream IT container 606 or into closed-loop outlet 208.

If at block 710 sensor P1 does not indicate a pressure increase, the process moves to block 714, where it checks whether pressure is decreasing. If at block 714 there is no pressure decrease (i.e., the pressure is steady, since it is neither increasing at block 710 nor decreasing at block 714), the process returns to block 708. But if at block 714 the pressure is decreasing, the process moves to block 716, where three-way valve V1 is adjusted to increase the ratio of fluid flowing from port #1 to port #2—i.e., V1 is adjusted to direct more flow from port #1 into port #2, directing more fluid to pump 212, where its pressure can be boosted. The process then moves to block 718 and proceeds through blocks 720-724 as described above.

FIG. 7B illustrates closed-loop operation of the system. If at block 706 (FIG. 7A) the process determines that the system will operate in closed-loop mode, it moves to the start of the closed-loop process at block 726, where it sets three-way valve V2 so that only ports #1 and #2 are open, thus directing all fluid flow into the closed-loop outlet, and proceeds to block 728.

At block 728, the process checks whether pressure, as determined by sensor P1, is increasing. If at block 728 pressure is increasing, the process moves to block 730, where it checks whether flow rate, measured by flow rate sensor M1, is increasing. If at block 730 flow rate is increasing, the process moves to block 732, where it decreases the speed of pump 212, and then returns to block 726. But if at block 730 flow rate is not increasing (i.e., pressure is increasing at block 728 but flow rate is not increasing), then the process moves to block 736, where V1 is adjusted to decrease the open ratio of port #1 to port #2—i.e., to direct more fluid from port #1 into port #2. The process then returns to block 726.

If at block 728 there is no pressure increase, the process moves to block 738, where it checks whether the pressure is decreasing instead of increasing. If pressure is not decreasing at block 738 (i.e., the pressure is steady, since it is neither increasing at block 728 nor decreasing at block 738), the process returns to block 726. But if at block 738 there is a pressure decrease, the process moves to block 740.

At block 740, the process determines whether the flow rate is decreasing. If at block 740 there is no flow rate decrease despite the pressure drop at block 738, the process moves to block 746, where three-way valve V1 is adjusted to increase the flow ratio from port #1 to port #2 (i.e., to increase the amount of fluid directed from port #1 into port #2) and/or adjusted to increase the flow ratio from port #1 to port #3 (i.e., to increase the amount of fluid directed from port #1 into port #3). Having made the adjustments to V1 at block 746, the process returns to block 726.

But if at block 740 the process determines that, in addition to the pressure drop at block 738, there is a flow rate decrease at block 740, the process moves to block 742, where it checks whether pump 212 is operating normally. If at block 742 the pump is operating normally, the process moves to block 744, where it increases the pump speed, and then returns to block 726. But if at block 742 the pump is not operating normally, the process moves to block 748, where three-way valve V1 is adjusted to only open ports #1 and #3—i.e., V1 is adjusted to direct all flow from port #1 to port #3, and none to port #2. Having adjusted valve V1 at block 748, the process returns to block 704.

Other embodiments of cooling systems are possible besides the ones described above. For instance:

The cooling hardware system arrangement can be modularized and arranged in different ways.

The cooling hardware modules can be connected in different methods.

Additional sensors can be used in the system to add additional features.

The above description of embodiments is not intended to be exhaustive or to limit the invention to the described forms. Specific embodiments of, and examples for, the invention are described herein for illustrative purposes, but various modifications are possible.

What is claimed is:

1. A cooling unit comprising:
a unit inlet, an open-loop outlet, and a closed-loop outlet;
a fluid bypass line having a first three-way valve and a second three-way valve coupled therein, wherein the fluid bypass line is fluidly coupled to the unit inlet and is fluidly coupled by the second three-way valve to the open-loop outlet and the closed-loop outlet;
a main cooling loop fluidly coupled to the fluid bypass line, the main cooling loop comprising:
a heat exchanger having an inlet and an outlet, the inlet of the heat exchanger being fluidly coupled by a supply line to the fluid bypass line at or near the unit inlet, and the outlet of the heat exchanger being coupled by a return line to the fluid bypass line between the first three-way valve and the second three-way valve;
a pump fluidly coupled in the return line; and
a two-way line fluidly coupled to the first three-way valve and to the return line upstream of the pump.

2. The cooling unit of claim 1, wherein the heat exchanger further comprises an external inlet coupled to a facility cooling fluid source and an external outlet fluidly coupled by a control valve to a facility hot fluid return.

3. The cooling unit of claim 1, further comprising a flow rate sensor, a pressure sensor, and a temperature sensor coupled to the fluid bypass line.

4. The cooling unit of claim 3, further comprising a control system that is communicatively coupled to the flow rate sensor, the pressure sensor, and the temperature sensor and also communicatively coupled to the external outlet control valve, the pump, the first three-way valve and the second three-way valve.

5. The cooling unit of claim 4, wherein:
the flow rate sensor is positioned in the bypass line upstream of where the heat exchanger inlet is fluidly coupled to the bypass line;
the pressure sensor is fluidly coupled to the bypass line between the second three-way valve and where the pump is fluidly coupled to the bypass line;
the temperature sensor is fluidly coupled to the bypass line between the second three-way valve and where the pump is fluidly coupled to the bypass line.

6. The cooling unit of claim 4, wherein:
the flow rate sensor is positioned in the bypass line between the second three-way valve and where the pump is fluidly coupled to the bypass line;
the pressure sensor is fluidly coupled to the bypass line between the second three-way valve and where the pump is fluidly coupled to the bypass line; and
the temperature sensor is fluidly coupled to the bypass line between the second three-way valve and where the pump is fluidly coupled to the bypass line.

7. A cooling system comprising:
an information technology (IT) container including a container inlet, a container outlet, and a container flow path fluidly coupled between the container inlet and the container outlet for cooling heat-generating components within the IT container, and the IT container including a closed-loop container inlet fluidly coupled by a closed-loop flow path to an inlet of the container flow path;
a cooling unit fluidly coupled to the IT container, the cooling unit comprising:
a unit inlet, an open-loop outlet, and a closed-loop outlet,
a fluid bypass line having a first three-way valve and a second three-way valve coupled therein, wherein the fluid bypass line is fluidly coupled to the unit inlet and is fluidly coupled by the second three-way valve to the open-loop outlet and the closed-loop outlet, and
a main cooling loop fluidly coupled to the fluid bypass line, the main cooling loop including:
a heat exchanger having an inlet and an outlet, the inlet of the heat exchanger being fluidly coupled by a supply line to the fluid bypass line at or near the unit inlet, and the outlet of the heat exchanger being coupled by a return line to the fluid bypass line between the first three-way valve and the second three-way valve,
a pump fluidly coupled in the return line, and
a two-way line fluidly coupled to the first three-way valve and to the return line upstream of the pump;

wherein the IT container is positioned downstream of the cooling unit, with the container inlet fluidly coupled to the open-loop outlet, or wherein the IT container is positioned upstream of the cooling unit, with the container outlet fluidly coupled to the unit inlet and the closed-loop outlet fluidly coupled to the closed-loop container inlet.

8. The cooling system of claim 7, wherein the heat exchanger further comprises an external inlet coupled to a facility cooling fluid source and an external outlet fluidly coupled by a control valve to a facility hot fluid return.

9. The cooling system of claim 7, further comprising a flow rate sensor, a pressure sensor, and a temperature sensor coupled to the fluid bypass line.

10. The cooling system of claim 9, further comprising a control system that is communicatively coupled to the flow rate sensor, the pressure sensor, and the temperature sensor and also communicatively coupled to the external outlet control valve, the pump, the first three-way valve and the second three-way valve.

11. The cooling system of claim 10, wherein:
the flow rate sensor is positioned in the bypass line upstream of where the heat exchanger inlet is fluidly coupled to the bypass line;
the pressure sensor is fluidly coupled to the bypass line between the second three-way valve and where the pump is fluidly coupled to the bypass line;
the temperature sensor is fluidly coupled to the bypass line between the second three-way valve and where the pump is fluidly coupled to the bypass line.

12. The cooling system of claim 10, wherein:
the flow rate sensor is positioned in the bypass line between the second three-way valve and where the pump is fluidly coupled to the bypass line;
the pressure sensor is fluidly coupled to the bypass line between the second three-way valve and where the pump is fluidly coupled to the bypass line; and
the temperature sensor is fluidly coupled to the bypass line between the second three-way valve and where the pump is fluidly coupled to the bypass line.

13. The cooling system of claim 7, in the IT container the closed-loop container inlet and the closed-loop flow path are bidirectional.

14. The cooling system of claim 13, wherein the closed-loop outlet is bidirectional, so that it functions as part of a closed loop when operated in one direction with the closed-loop container inlet and the closed-loop flow path and functions as a bypass for bypassing the IT container and the cooling unit when operated in the other direction with the closed-loop container inlet and the closed-loop flow path.

15. A process comprising:
fluidly coupling a cooling unit to an upstream information technology (IT) container, a downstream IT container, or both an upstream IT container and a downstream IT container, wherein:
each IT container includes a container inlet, a container outlet, and a container flow path fluidly coupled between the container inlet and the container outlet for cooling heat-generating components within the IT container, and the IT container including a closed-loop container inlet fluidly coupled by a flow path to an inlet of the container flow path;

the cooling unit comprises:
a unit inlet, an open-loop outlet, and a closed-loop outlet,
a fluid bypass line having a first three-way valve and a second three-way valve coupled therein, wherein the fluid bypass line is fluidly coupled to the unit inlet and is fluidly coupled by the second three-way valve to the open-loop outlet and the closed-loop outlet, and
a main cooling loop fluidly coupled to the fluid bypass line, the main cooling loop including:
a heat exchanger having an inlet and an outlet, the inlet of the heat exchanger being fluidly coupled by a supply line to the fluid bypass line at or near the unit inlet, and the outlet of the heat exchanger being coupled by a return line to the fluid bypass line between the first three-way valve and the second three-way valve,
a pump fluidly coupled in the return line, and
a two-way line fluidly coupled to the first three-way valve and to the return line upstream of the pump;
wherein the container inlet of the downstream IT container is fluidly coupled to the open-loop outlet and wherein the container outlet of the upstream IT container is fluidly coupled to the unit inlet and the closed-loop container inlet of the upstream IT container is fluidly coupled to the closed-loop outlet;
setting the second three-way valve to direct cooling fluid to the downstream IT container, the upstream IT container, or both the upstream and downstream IT containers.

16. The process of claim 15, further comprising adjusting the operation of the cooling unit using the first three-way valve.

17. The process of claim 15, further comprising a control system that is communicatively coupled to a flow rate sensor, a pressure sensor, and a temperature sensor and also communicatively coupled to the pump, the first three-way valve and the second three-way valve.

18. The process of claim 17, further comprising using the control system, the first three-way valve, the second three-way valve, and the pump to adjust a flow path within the cooling unit.

19. The process of claim 18, wherein the flow path within the cooling unit includes the bypass line, the main cooling loop, or both the bypass line and the main cooling loop.

20. The process of claim 18, wherein the closed-loop container inlet, a closed-loop flow path in the IT container, and the closed-loop outlet and the closed-loop flow path in the cooling unit are bidirectional, and further comprising bypassing the cooling unit by:
reversing the flow through the closed-loop flow path, the closed-loop container inlet, and the closed-loop outlet; and
setting the second three-way valve to direct fluid received through the closed-loop outlet only into the open-loop outlet.

* * * * *